United States Patent [19]

Martyashin et al.

[11] 3,962,629
[45] June 8, 1976

[54] DEVICE FOR MEASUREMENT OF PARAMETERS OF COMPOUND ELECTRIC CIRCUIT ELEMENTS

[76] Inventors: Alexandr Ivanovich Martyashin, ulitsa Kirova, 69, kv. 59; Andrei Elizarovich Morozov, ulitsa Uritskogo, 44/10, kv. 62; Ljudmila Vladimirovna Orlova, ulitsa Popova, 2, kv. 75; Viktor Mikhailovich Shlyandin, ulitsa Lermontova, 12, kv. 17, all of Penza, U.S.S.R.

[22] Filed: May 15, 1975

[21] Appl. No.: 577,747

[52] U.S. Cl. .............................................. 324/57 R
[51] Int. Cl.² .......................................... G01R 27/00
[58] Field of Search ............ 324/123 R, 57 R, 158 R

[56] References Cited
UNITED STATES PATENTS

| | | | |
|---|---|---|---|
| 3,593,126 | 7/1971 | May | 324/57 R |
| 3,612,993 | 10/1971 | Tims et al. | 324/57 R |

*Primary Examiner*—R. V. Rolinec
*Assistant Examiner*—Ernest F. Karlsen
*Attorney, Agent, or Firm*—Haseltine, Lake & Waters

[57] ABSTRACT

A device for measurement of parameters of compound electric circuit elements, including a unit of calibrated elements suitable for analyzing an electric circuit. The unit of calibrated elements includes a switchable measuring circuit having an output voltage used to determine the parameters of parallel-and series-connected two terminal RLC circuits in delta-and star-connected multiterminal circuit branches.

1 Claim, 7 Drawing Figures

DEVICE FOR MEASUREMENT OF PARAMETERS OF COMPOUND ELECTRIC CIRCUIT ELEMENTS

The present invention relates to electric measuring facilities, and, more particularly, to a device for measurement of the parameters of compound electric circuit elements, intended chiefly for measurement of the parameters of the elements of electronic equipment circuits without disruption of the integrity thereof, for measurement of the parameters of RLC circuit components in compound circuits, for measurement of the parameters of electric filters and compound circuits in wire communication, for measurement of the RLC components of equivalent circuits serving to infer various processes, and for measurement of signal parameters in RLC transmitters and microelement transmitters.

Known in the art is a device for measurement of the parameters of compound electric circuits, comprising a unit of calibrated elements, the input thereof is electrically coupled with the output of the first operational amplifier and with the output of the second operational amplifier, the noninverting input thereof is electrically coupled with the ground bus, and the inverting input thereof together with the output of the unit of calibrated elements is connected to one terminal of the electric circuit being analyzed, the other terminal thereof is electrically coupled with the output of the second operational amplifier and with the mid point of the output of the first operational amplifier, input of the pulse spacing and frequency measuring unit, one terminal of the first resistor and input of the pulse shaping unit, the output thereof is connected to the control input of the electronic switch, the other input thereof is connected to the input of the third operational amplifier, with a resistor inserted into the feedback circuit thereof, and to one of the terminals of the network of two series-connected capacitors, the mid point thereof is electrically coupled with the output of the second operational amplifier, and the output of the electronic switch is connected to the output of the third operational amplifier and to one terminal of the second resistor, the other terminal thereof is brought to the other terminal of the first resistor and to the other terminal of the network of two-series-connected capacitors, as well as to the input of the fourth operational amplifier, the feedback circuit thereof includes a capacitor, and the output thereof is connected to the input of the first operational amplifier.

Said device comprises a selector switch including two sets of contacts, each of these incorporating an input and two terminals. The input of the first set of contacts is directly connected to the output of the first operational amplifier, and the input of the second set of contacts is coupled to the output of the second operational amplifier which is connected directly to the mid point of two series-connected capacitors. The noninverting input of the second operational amplifier is connected directly to the ground bus.

The first terminal of the first set of contacts and the second terminal of the second set of contacts are connected to the other terminal of the electric circuit being analyzed. The second terminal of the first set of contacts and the first terminal of the second set of contacts are connected to the input of the unit of calibrated elements, comprising a calibrated resistor, capacitor and inductance coil.

Said selector switch couples the outputs of the first and second operational amplifiers to the input of the unit of calibrated elements and to the other terminal of the electric circuit being analyzed. In the first position of the selector switch, the output of the first operational amplifier is connected to the second terminal of the analyzed electric circuit, and the output of the second operational amplifier is coupled with the input of the unit of the calibrated element. With the units connected as described above, the device permits measurement of the parameters of two-terminal parallel RLC circuits.

In the second position of the selector switch, the output of the first operational amplifier is connected to the input of the unit of the calibrated elements, and the output of the second operational amplifier is coupled with the second terminal of the circuit being analyzed. With the units connected in this manner, the device permits measurement of the parameters of two-terminal series RLC circuits.

The foregoing schematic design of the device as a whole, the functional possibilities of the device are rather narrow and do not permit measurement of the parameters of compound multiterminal electric circuits because the influence of the non-analyzed multiterminal circuit branches upon the results of measurements is not obviated.

The object of the present invention is to provide a device for measurement of the parameters of composite electric circuits, whereby the values of each element in the compound multiterminal electric circuit can be evaluated.

This object is attained by providing a device for measurement of the parameters of compound electric circuits, comprising a unit of calibrated elements, the input thereof is electrically coupled with the output of the first operational amplifier and with the output of the second operational amplifier, the noninverting input thereof is electrically coupled with a ground bus, and the inverting input thereof together with the output of the unit of calibrated elements is connected to one terminal of the analyzed electric circuit, the other terminal thereof is electrically coupled with the output of the second operational amplifier and with the mid point of the output of the first operational amplifier, input of the pulse spacing and frequency measuring unit, one terminal of the first resistor and input of the pulse shaping unit, the outlet thereof is connected to the control input of the electronic switch, the other input thereof is connected to the input of the third operational amplifier, the feedback circuit thereof includes a resistor, and to one terminal of the network of two series-connected capacitors, the mid point thereof is electrically coupled with the output of the second operational amplifier, and the output of the electronic switch is connected to the output of the third operational amplifier and to one terminal of the second resistor, the other terminal thereof is connected to the other terminal of the first resistor and to the other terminal of the network of two series-connected capacitors, as well as to the input of the fourth operational amplifier, the feedback circuit thereof includes a capacitor, and the output thereof is connected to the input of the first operational amplifier, which, according to the invention, incorporates an extra capacitor, one terminal thereof is connected to the input of the fourth operational amplifier, an inverter unit, the input thereof is connected to the output of the first operational amplifier; a fifth operational amplifier, and a switchgear including two selector switches, and electrically coupling the output of the first operational amplifier, the second and the third terminals of the analyzed electric circuit, the noninverting input and output of the second operational amplifier, the inverting and non-inverting inputs of the fifth operational amplifier, the input of the unit of calibrated elements, and the mid point of two series-connected capacitors to the inverting and noninverting inputs and output of the fifth operational amplifier, to the input of the unit of calibrated elements, to the output of the second operational amplifier, to the output of the inverter unit, to the other terminal of the extra capacitor, to the second and third terminals of the analyzed circuit, to the output of the unit of calibrated elements, to the output of the first operational amplifier and to the ground bus so that with both selector switches placed to the first position, the output of the first operational amplifier is connected to the other terminal of the extra capacitor, the noninverting input of the second operational amplifier is connected to the output of the inverter unit, while the output of the second operational amplifier is connected to the mid point of two series-connected capacitors and to the input of the unit of calibrated elements, the output thereof is connected to the noninverter input of the fifth operational amplifier, the inverting input and output thereof are connected to the third terminal of the electric circuit being analyzed, the second terminal thereof is connected to the ground bus, with the result that the parameters of the parallel RLC circuits in the delta-connected multiterminal circuit branches can be measured; with the first and second selector switches placed to the first and second positions, respectively, the output of the first operational amplifier is connected to the other terminal of the extra capacitor, the noninverting input of the second operational amplifier is connected to the input of the inverter unit, and the output thereof is connected to the mid point of two series-connected capacitors and to the second terminal of the analyzed electric circuit, the third terminal thereof is coupled with the inverting input and output of the fifth operational amplifier, the noninverting input thereof is connected to the output of the unit of calibrated elements, the input thereof is in its turn connected to the ground bus, with the result that the parameters of the series RLC circuits in the delta-connected multiterminal circuits can be measured; with the first and second selector switches placed to the second and first positions, respectively, the output of the first operational amplifier is connected to the noninverting input of the fifth operational amplifier, the inverting input thereof is connected to the other terminal of the electric circuit being analyzed, the third terminal thereof is connected to the output of said fifth operational amplifier, the noninverting input of the second operational amplifier is connected to the ground bus, and the output of said amplifier is connected to the input of the unit of calibrated elements and to the mid point of two series-connected capacitors, with the result that the parameters of the parallel RLC circuits in the star-connected multiterminal circuit branches can be measured; and with both selector switches placed to the second position, the output of the first operational amplifier is connected to the input of the unit of calibrated elements, the noninverting input of the second operational amplifier is connected to the ground bus, the output of said second operational amplifier is connected to the second terminal of the analyzed electric circuit, the third terminal thereof is connected to the noninverting input of the fifth operational amplifier, the inverting input thereof is connected to the output of the same operational amplifier, with said output connected to the mid point of two series-connected capacitors, with the result that the parameters of the series RLC circuits in the star-connected multiterminal circuit branches can be measured.

The device for measurement of parameters of compound electrical circuit elements, according to the invention, permits measurements of the values R, L and C of the elements inserted in series and in parallel in the delta- and star-connected multiterminal circuit branches to a high accuracy, and is distinguished for simple construction and small size. The device of this invention may likewise be used for measurement of parameters of the elements included into series and parallel two-terminal RLC circuits.

The invention will now be described in more detail with reference to a preferred embodiment thereof taken in conjunction with the accompanying drawings, wherein.

Figure 1:
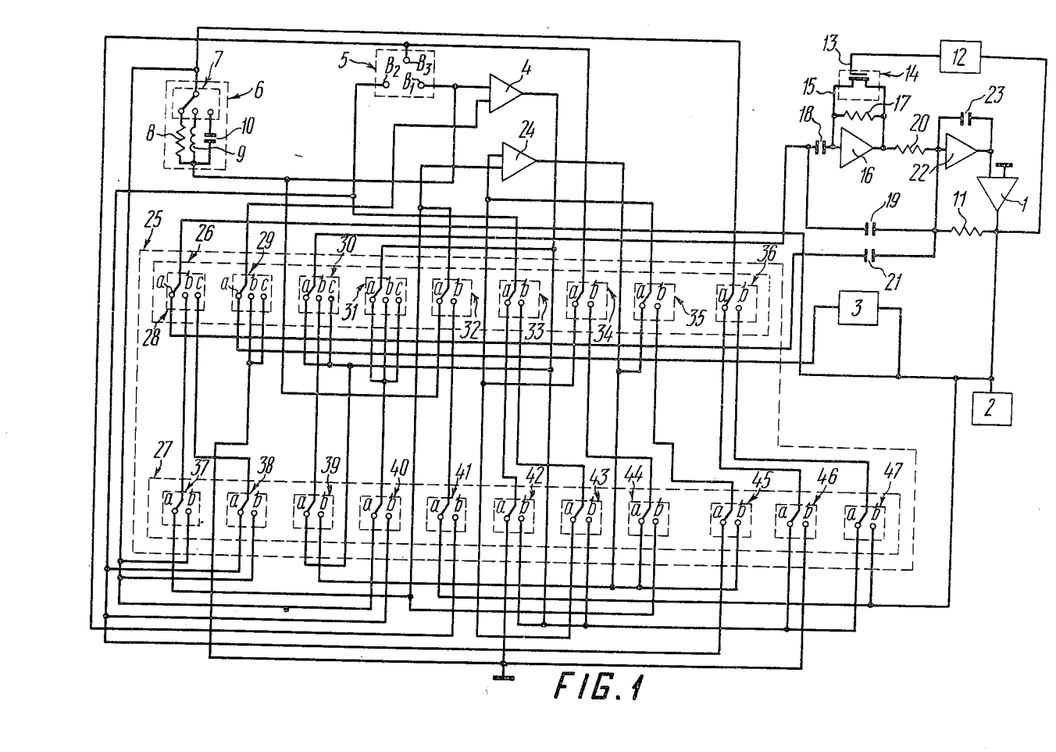
FIG. 1 presents a functional diagram of a device for measurement of parameters of compound electric circuits, according to the invention.

Referring now to FIG. 1, the device of the present invention comprises a first operational amplifier 1, the output thereof is connected to the input of a pulse spacing and frequency measuring unit 2 completed according to a known diagram. The output of the operational amplifier 1 is also connected to the input of an inverter unit 3, connected according to a known diagram. To fulfil the functions of the inverter unit 3, use is made of an operational amplifier operating in a phase-inversion mode (cf. ELEKTRONNIYE ANALOGOVIYE I ANALOGOTZIFROVIYE VYCHISLITELNIYE MASHINY /ELECTRONIC ANALOG AND ANALOG DIGITAL COMPUTERS/ by G. TORN, T. TORN, Mir Publishing House, Moscow, 1967, p. 23, Fig. 1.66).

The device comprises also a second differential operational amplifier 4, the inverting input thereof is connected to one of terminals $B_1$ of an analyzed circuit 5 and to the output of a unit 6 of calibrated elements, comprising a selector switch 7 in the form of a mechanical-action three-way slide-contact switch, a calibrated resistor 8 with a resistance $R_o$, a calibrated coil 9 with an inductance $L_o$ and a calibrated capacitor 10 with a capacitance $C_o$. The input of the selector switch 7 serves as an input of the unit 6 of calibrated elements, the output thereof is brought to the mid point of the terminals of the calibrated resistor 8, capacitor 10 and inductance coil 9.

The input of the pulse spacing and frequency measuring unit 2 together with the output of the operational amplifier 1 is connected to one of the terminals of a first resistor 11 at the input of a pulse shaping unit 12 connected according to a widely known diagram, specifically, as a biased multivibrator.

The output of the pulse shaping unit 12 is connected to a control input 13 of an electronic switch 14 which uses a field-effect transistor. The other input 15 of the electronic switch 14 is connected to the input of a third operational amplifier 16, the feedback circuit thereof includes a resistor 17, and to one terminal of a network of two series-connected capacitors 18 and 19. The output of the electronic switch 14 is connected to the output of the operational amplifier 16 and to one terminal of a second resistor 20, the other terminal thereof is connected to the other terminal of the first resistor 11, to the other terminal of the network of two series-connected capacitors 18 and 19, to one terminal of a capacitor 21, and to the input of a fourth operational amplifier 22. A capacitor 23 is inserted into the feedback circuit of the operational amplifier 22, the output thereof is connected to the input of the operational amplifier 1.

The device incorporates a fifth differential operational amplifier 24 and a switchgear 25 comprising two selector switches 26 and 27, made in the form of mechanical-action two-way slide-contact selector switches.

The selector switch 26 includes nine sets of contacts 28, 29, 30, 31, 32, 33, 34, 35 and 36, each comprising an input and two terminals $a$ and $b$. Besides, a terminal $c$ is provided for measurement of two-terminal circuit parameters.

The selector switch 27 includes eleven sets of contacts 37, 38, 39, 40, 41, 42, 43, 44, 45, 46 and 47, each comprising one input and two terminals $a$ and $b$. The set of contacts 38 serves for measurement of two-terminal circuit parameters.

The selector switches 26 and 27 are transferred from one position to another manually, the like terminals of each switch being simultaneously connected to the inputs of the respective sets of contacts.

The inputs and the terminals $a$ and $b$ in both selector switches are connected to the units of the device and to one another as follows.

The input of the set 28 of contacts is connected to the output of the operational amplifier 1; the input of the set 29 of contacts is connected to the noninverting input of the operational amplifier 4, the input of the set 30 of contacts is connected to the mid point of two series-connected capacitors 18 and 19; the input of set 31 of contacts is connected to the output of the operational amplifier 4; the input of the set 32 of contacts is connected to the noninverting input of the operational amplifier 24, the input of the set 33 of contacts is connected to the second terminal $B_2$ of the electric circuit 5 being analyzed; the input of the set 34 is connected to the third terminal $B_3$ of the electric circuit 5 being analyzed, the input of the set 35 of contacts is connected to the inverting input of the operational amplifier 24, and the input of set 36 of contacts is connected to the input of the unit 6 of calibrated elements.

The terminal $a$ of the set 28 of contacts is connected to the terminal of the capacitor 21, and the terminal $b$ thereof is connected to the input of the set 37 of contacts. The terminal $a$ of the set 29 of contacts is connected to the output of the inverter unit 3, and the terminal $b$ thereof is connected to the ground bus. The terminal $a$ of the set 30 of contacts is connected to the output of the operational amplifier 4, and the terminal $b$ thereof is connected to the input of the set 39 of contacts. The terminals $a$ and $b$ of the set 31 of contacts are connected to the input of the set 40 of contacts. The terminal $a$ of the set 32 of contacts is connected to the output of unit 6 of calibrated elements and to the inverting input of the operational amplifier 4, and the terminal $b$ thereof is connected to the input of the set 41 of contacts. The terminal $a$ of the set 33 of contacts is connected to the input of set 42 of contacts, and the terminal $b$ thereof is connected to the input of the set 43 of contacts. The terminal $a$ of the set 34 of contacts is connected to the inverting input of the operational amplifier 24, and the terminal $b$ thereof is connected to the input of the set 44 of contacts. The terminal $a$ of the set 35 of contacts is connected to the output of the operational amplifier 24, and the terminal $b$ thereof is connected to the input of the set 45 of contacts. The terminal $a$ of the set 36 of contacts is connected to the input of the set 46 of contacts, and the terminal $b$ thereof is connected to the input of the set 47 of contacts.

The terminal $a$ of the set 37 of contacts is connected to the noninverting input of the operational amplifier 24, and the terminal $b$ thereof is connected to the input of the unit 6 of calibrated elements. The terminal $a$ of the set 39 of contacts is connected to the output of the operational amplifier 4, and the terminal $b$ thereof is connected to the output of the operational amplifier 24. The terminal $b$ of the set 40 of contacts is connected to the second terminal $B_2$ of the analyzed electric circuit 5, and the terminal $a$ thereof is connected to the input of the unit 6 of calibrated elements. The terminal $a$ of the set 41 of contacts is connected to the output of the operational amplifier 1, and the terminal $b$ thereof is connected to the third terminal $B_3$ of the electric circuit 5 being analyzed. The terminal $a$ of the set 42 of contacts is connected to the ground bus, and the terminal $b$ thereof is connected to the output of the operational amplifier 4. The terminal $a$ of the set 43 of contacts is connected to the inverting input of the operational amplifier 24, and the terminal $b$ thereof is connected to the output of the operational amplifier 4. The terminal $a$ of the set 44 of contacts is connected to the output of the operational amplifier 24, and the terminal $b$ thereof is connected to the noninverting input of said operational amplifier 24. The terminal $a$ of the set 45 of contacts is connected to the second terminal $B_2$ of the circuit 5 being analyzed, and the terminal $b$ thereof is connected to the output of the operational amplifier 24. The terminal $a$ of the set 46 of contacts is connected to the output of the operational amplifier 4, and the terminal $b$ thereof is connected to the ground bus. The terminal $a$ of the set 47 of contacts is connected to the output of the operational amplifier 4, and the terminal $b$ thereof is connected to the output of the operational amplifier 1.

As stated above, to permit measurement of the parameters of the two-terminal circuits, the sets 28, 29, 30 and 31 of contacts of the selector switch 26 incorporate the terminals c, and the selector switch 27 is provided with the set 38 of contacts. The terminal c of the set 28 of contacts is connected to the input of the set 38 of contacts; the terminal c of the set 29 of contacts is connected to the ground bus; the terminal c of the set 30 of contacts is connected to the output of the operational amplifier 4; and the terminal c of the set 31 of contacts is connected to the input of the set 40 of contacts. The terminal b of the set 38 of contacts is connected to the input of the unit 6 of calibrated elements, and the terminal a thereof is connected to the second terminal $B_2$ of the circuit 5 being analyzed.

The selector switches 26 and 27 of the switchgear 25 serve for electrical coupling of the output of the operational amplifier 1, the second and third terminals $B_2$ and $B_3$ of the electric circuit 5 being analyzed, the noninverting input and the output of the operational amplifier 4, the inputs of the operational amplifier 24, the input of the unit 6 of calibrated elements, and the mid point of two series-connected capacitors 18 and 19 with the inputs and output of the operational amplifier 24, the input of the unit 6 of the calibrated elements, the output of the operational amplifier 4, the output of the inverter unit 3, the second terminal of the capacitor 21, the second and the third terminals $B_2$ and $B_3$ of the electric circuit 5 being analyzed, the output of the unit 6 of calibrated elements, the output of the operational amplifier 1, and the ground bus. With the selector switches 26 and 27 placed to the position a, the output of the operational amplifier 1 (FIG. 2) is connected to the other terminal of the capacitor 21, the noninverting input of the operational amplifier 24 is connected to the output of the unit 6 of calibrated elements, the second terminal $B_2$ of the electric circuit 5 being analyzed is connected to the ground bus, the third terminal $B_3$ of the electric circuit 5 being analyzed is connected to the inverting input and output of the operational amplifier 24, the non-inverting input of the operational amplifier 4 is connected to the output of the inverter unit 3, and the output of the operational amplifier 4 is connected to the input of the unit 6 of calibrated elements and to the mid point of two series-connected capacitors 18 and 19.

Figure 2:
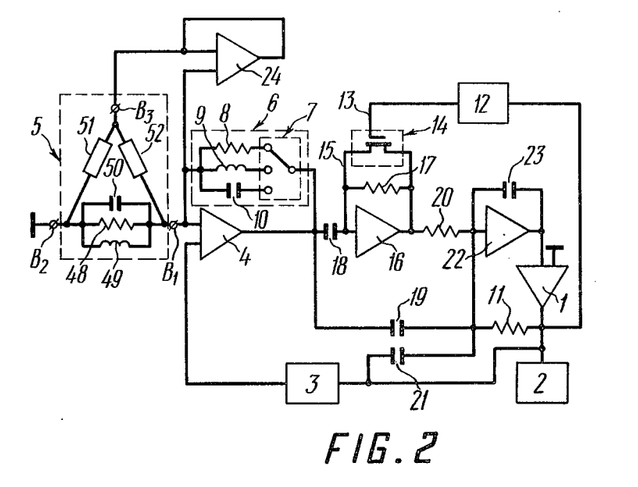
FIG. 2 presents a functional diagram of the device of this invention at measurement of parameters of elements of parallel RLC circuits in delta-connected multiterminal circuit branches.

With such connection of the units, the device, according to the invention, permits measurement of the parameters of the parallel RLC circuits in the delta-connected multiterminal circuit branches. In the case described above, the analyzed electric circuit 5 is a delta-connected multiterminal circuit, one branch thereof with parameters being measured comprises parallel-connected resistor 48 with a resistance $R_x$, inductance coil 49 with an inductance $L_x$ and capacitor 50 with a capacitance $C_x$. Branches 51 and 52 constitute a compound aggregation of R, L and C elements and nonlinear elements.

Referring to FIG. 1, with the selector switch 26 placed to the position a, and with the selector switch 27 placed to the position b, the output of the operational amplifier 1 (FIG. 3) is connected to the other terminal of the capacitor 21, the output of the unit 6 of calibrated elements is connected to the noninverting input of the operational amplifier 24, the second terminal $B_2$ of the electric circuit 5 being analyzed is connected to the output of the operational amplifier 4, and the third terminal $B_3$ thereof is connected to the inverting input and output of the operational amplifier 24, the noninverting input of the operational amplifier 4 is connected to the output of the inverter unit 3, the input of the unit 6 of calibrated elements is connected to the ground bus, and the mid point to two series-connected capacitors 18 and 19 is connected to the output of the operational amplifier 4.

Figure 3:
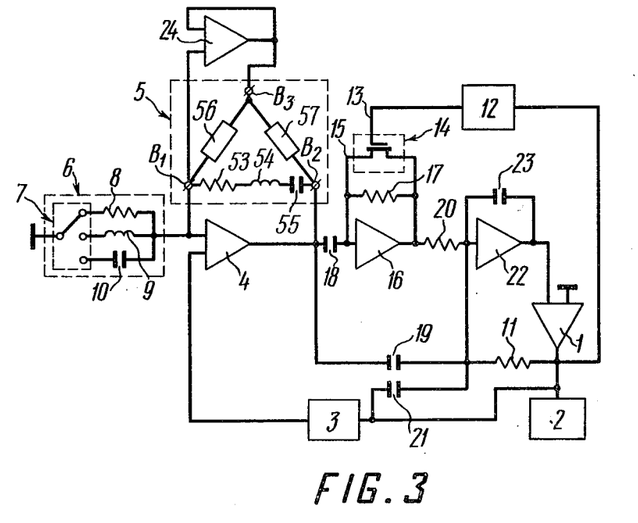
FIG. 3 presents a functional diagram of the device of this invention at measurement of parameters of elements of series RLC circuits in delta-connected multiterminal circuit branches.

When the units of the device of this invention are connected as above, the device permits measurement of the parameters of the series RLC circuits in the delta-connected multiterminal circuit branches. In the case described above, the electric circuit 5 being analyzed is a delta-connected multiterminal circuit, one branch thereof with the parameters being measured comprises parallel-connected resistor 53 with a resistance $R_x$, inductance coil 54 with an inductance $L_x$ and capacitor 55 with a capacitance $C_x$. Two other branches 56 and 57 constitute a compound aggregation of R, L and C elements and nonlinear elements.

With the selector switch 26 (FIG. 1) placed to the position b, and with the selector switch 27 placed to the position a, the output of the operational amplifier 1 (FIG. 4) is connected to the noninverting input of the operational amplifier 24, the inverting input thereof is connected to the second terminal $B_2$ of the electric circuit 5 being analyzed, the third terminal $B_3$ thereof is connected to the output of said operational amplifier 24, the noninverting input of the operational amplifier 4 is connected to the ground bus, and the input of the unit 6 of calibrated elements and the mid point of two series-connected capacitors 18 and 19 are connected to the output of the operational amplifier 4.

Figure 4:
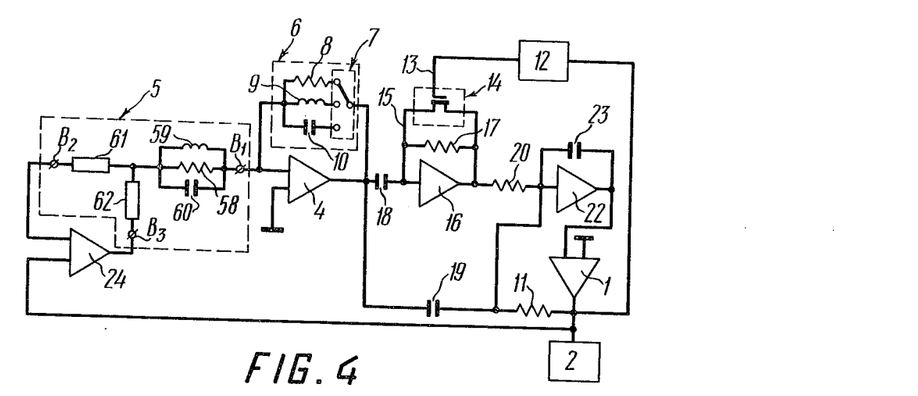
FIG. 4 presents a functional diagram of the device of this invention at measurement of parameters of elements of parallel RLC circuits in star-connected multiterminal circuit branches.

When the units of the device of the present invention are connected as above, the device permits measurement of the parameters of the parallel RLC circuits in the star-connected multiterminal circuit branches, the star point thereof is inaccessible. In the case described above, the electric circuit 5 is a star-connected multiterminal circuit, one branch thereof with the parameters being measured comprises parallel-connected resistor 58 with a resistance $R_x$, inductance coil 59 with an inductance $L_x$ and capacitor 60 with a capacitance $C_x$. Two other branches 61 and 62 constitute a compound aggregation of R, L and C elements and nonlinear elements.

With the selector switches 26 and 27 (FIG. 1) placed to the position b, the output of the operational amplifier 1 (FIG. 5) is connected to the input of the unit 6 of calibrated elements, the inverting input of the operational amplifier 24 is connected to the output of the same operational amplifier 24, the noninverting input thereof is connected to the third output $B_3$ of the electric circuit 5 being analyzed, the second terminal $B_2$ thereof is connected to the output of the operational amplifier 4, the noninverting input thereof is connected to the ground bus, and the mid point of two series-connected capacitors 18 and 19 is connected to the output of the operational amplifier 24.

Figure 5:
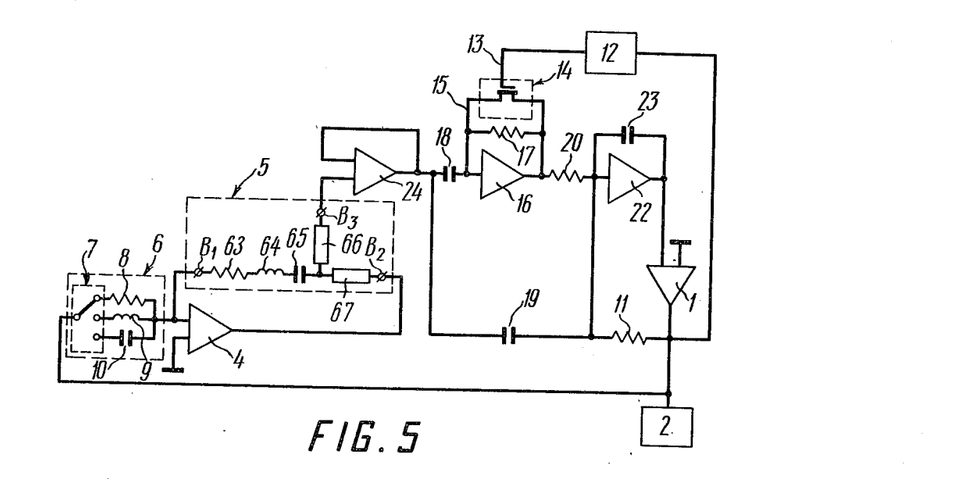
FIG. 5 presents a functional diagram of the device of this invention at measurement of parameters of elements of series RLC circuits in star-connected multiterminal circuit branches.

With the units connected as above, the device permits measurement of the parameters of the series RLC circuits in the star-connected multiterminal circuit branches. In the case described above, the electric circuit 5 is a star-connected multiterminal circuit, one branch thereof with the parameters being measured comprises series-connected resistor 63 with a resistance $R_x$, inductance coil 64 with an inductance $L_x$ and capacitor 65 with a capacitance $C_x$. Two other branches 66 and 67 constitute a compound aggregation of R, L and C elements and nonlinear elements.

With the selector switch 26 (FIG. 1) placed to the position c, and with the selector switch 27 placed to the position a, the output of the operational amplifier 1 (FIG. 6) is connected to the second terminal $B_2$ of the electric circuit 5 being analyzed, the noninverting input of the operational amplifier 4 is connected to the ground bus, and the output of said operational amplifier 4 is connected to the input of the unit 6 of calibrated elements and to the mid point of two series-connected capacitors 18 and 19.

Figure 6:
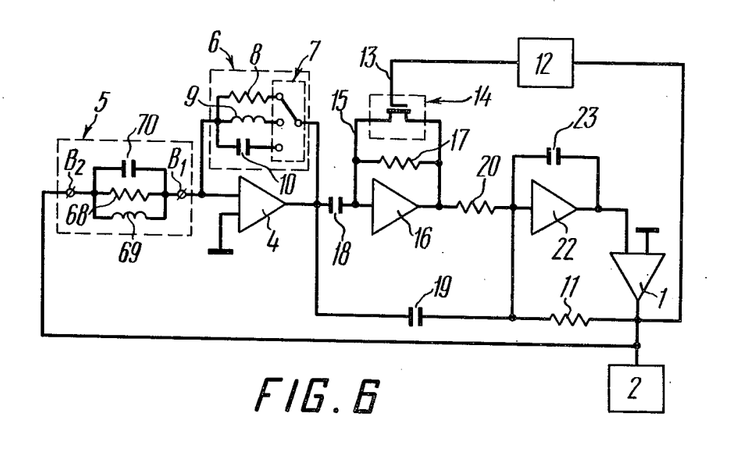
FIG. 6 presents a functional diagram of the device of this invention at measurement of parameters of elements of parallel two-terminal circuits.

When the units are connected as above, the device of the present invention permits measurement of the parameters of the parallel two-terminal RLC circuits. In this case, the electric circuit 5 being analyzed comprises parallel-connected resistor 68 with a resistance $R_x$, inductance coil 69 with an inductance $L_x$ and capacitor 70 with a capacitance $C_x$.

With the selector switch 26 (FIG. 1) placed to the position c, and with the selector switch 27 placed to the position b, the output of the operational amplifier 1 (FIG. 7) is connected to the input 6 of calibrated elements, the noninverting input of the operational amplifier 4 is connected to the ground bus, and the output of said operational amplifier 4 is connected to the mid point of two series-connected capacitors 18 and 19 and to the second terminal $B_2$ of the electric circuit being analyzed.

Figure 7:
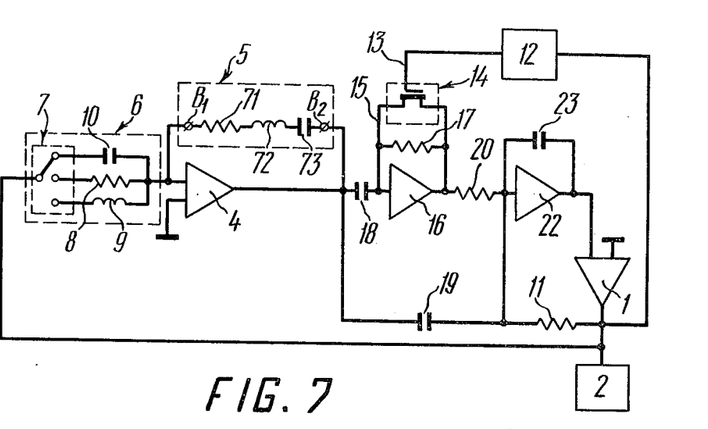
FIG. 7 presents a functional diagram of the device of this invention at measurement of parameters of elements of series two-terminal circuits.

When the units of the device of this invention are connected as above, the device permits measurement of the parameters of the series two-terminal RLC circuits. In the above case, the electric circuit 5 being analyzed comprises series-connected resistor 71 with a resistance $R_x$, inductance coil 72 with an inductance $L_x$ and capacitor 73 with a capacitance $C_x$.

In the four former cases, the multiterminal circuits are delta- and star-connected. The branches 51, 52, 56, 57, 62, 66 and 67 of said multiterminal circuits may be made in the form of single-element circuits (individual R, L and C elements and nonlinear elements) or any aggregation thereof.

The device for measurement of parameters of compound electric circuit elements, according to the invention, operates as follows.

At measurement of parameters of each element included into the multiterminal circuit branch being analyzed, the selector switch 7 (FIG. 1) in the unit 6 of calibrated elements cuts in one of the calibrated elements: for measurement of ohmic resistances $R_x$, the calibrated resistor 8 with the resistance $R_o$ is inserted; for measurement of inductances $L_x$, the calibrated inductance coil 9 with the inductance $L_o$ is inserted; and for measurement of capacitances $C_x$, the calibrated capacitor 10 with the capacitance $C_o$ is inserted.

At measurement of the parameters of parallel $R_xL_xC_x$ circuits in the delta-connected multiterminal circuit branches, the circuitry filfils the following functions.

The output voltage of the operational amplifier 1 (FIG. 2) supplied through the inverter unit 3 is forwarded to the noninverting input of the operational amplifier 4 operating as a noninverting scaling amplifier. The operational amplifier 24 operating as a voltage follower, sets a voltage across the mid point of nonanalyzed branches 51 and 52 at a level equal to that of the voltage at the inverting input of the operational amplifier 4. As a result, the branch 52 is electrically isolated, and the branch 51 is shunted by the low output resistance of the operational amplifier 24. Hence, the output voltage $U_1$ of the operational amplifier 4 does not depend on the action of the branches 51 and 52, and is given by:

$$U_1(P) = -U_2(P)\left[1 + \frac{Z_0(P)}{Z_x(P)}\right]; \qquad (1)$$

where:
p is the Laplase-Carson operator;
$U_2(p)$ is the output voltage of the operational amplifier 1;
$Z_x(p)$ is the operator resistance of the analyzed parallel $R_xL_xC_x$ circuit comprising the resistor 48, inductance coil 49 and capacitor 50;
$Z_0(p)$ is the operator resistance of the calibrated element.

During measurement of the capacitance $C_x$ of the capacitor 50 included into the parallel $R_xL_xC_x$ circuit in the delta-connected multiterminal circuit branch, the device operates as follows.

At connection of power supply to the device, the output of the operational amplifier 1 operating as a limiting amplifier is energized with a voltage, for example, $-E_o$. The output voltage of the operational amplifier 4 varies according to the formula (1) as follows:

$$U_1 = -E_o + E_o\ \frac{C_x}{C_o} + E_o\ \frac{1}{R_xC_o} + E_o\ \frac{1}{2L_xC_o}\cdot t^2$$

Said voltage is applied to the input of the operational amplifier 16 operating as a differentiator. At the instant when the electronic switch 14 is closed for a time $t'$ equal to the duration of the pulse shaped at the output of the pulse shaping unit 12, the output voltage of the operational amplifier 16 is zero. The capacitor 18 at the input of the operational amplifier 16 charges through the closed switch 14 to a value of the voltage jump $$+E_o + E_o\ \frac{C_x}{C_o}$$

across the output of the operational amplifier 4.

The pulse shaping unit 12 is driven and is triggered by each leading edge of the bidirectional input signal derived from the output of the operational amplifier 1, with the duration $t'$ of the pulse shaped being much less than the spacing of the pulses generated at the output of the operational amplifier 1.

At opening of the electronic switch 14, the output voltage $U_3$ of the operational amplifier 16 is equal to the derivative of the variable components of the voltage $U_1$:

$$U_3 = -E_o\ \frac{1}{R_xC_o}\tau g - E_o\ \frac{1}{L_xC_o}\tau g\cdot t\ ;$$

where:
$T_g$ is the differentiating time constant equal to the resistance of the resistor 17 multiplied by the capacitance of the capacitor 18.

Said voltage $U_3$ is applied to the input of the operational amplifier 22. Said amplifier 22 inverts the output voltage of the operational amplifier 4 across the circuit $C_1C_2$, where $C_1$ is the capacitance of the capacitor 19, and $C_2$ is the capacitance of the capacitor 23. Now the operational amplifier 22 integrates the output voltage of the operational amplifier 16 across the circuit $R_1C_2$, where $R_1$ is the resistance of the resistor 20; then said amplifier 22 inverts the output voltage of the operational amplifier 1 across the circuit $C_3C_2$, where $C_3$ is the capacitance of the capacitor 21; and then it integrates the output voltage of the operational amplifier 1 across the circuit $R_2C_2$, where $R_2$ is the resistance of the resistor 11.

The output voltage $U_4$ of the operational amplifier 22 is given by $$U_4 = -\frac{C_1}{C_2}\left(+E_o + E_o \frac{C_x}{C_o} + E_o \frac{1}{R_xC_o}t + E_o \frac{1}{2L_xC_o}t^2\right) +$$

$$+ E_o \frac{1}{R_xC_o} \cdot \frac{\tau g}{R_1C_2} \cdot t + E_o \frac{1}{2L_xC_o} \frac{\tau g}{R_1C_2}t^2 +$$

$$+ \frac{C_3}{C_2}E_o + E_o \frac{1}{R_2C_2} \cdot t \quad . \quad (2)$$

Since
$\tau_u = R_1C_2; C_1 = C_2, C_3 = C_2$,
the latter expression can be written as $$U_4 = -E_o \frac{C_x}{C_o} + E_o \frac{1}{R_2C_2}t \quad .$$

At the instant when the voltage across the input of the operational amplifier 1 is zero, the output voltage thereof abruptly reverses its polarity. The equation $$-E_o \frac{C_x}{C_o} + E_o \frac{1}{R_2C_2}t_o = 0$$

defines the time interval $t_o$ between starting of the device (connection of power supply) and the first instant when the output voltage of the operational amplifier 1 reverses its sign $$t_o = R_2C_2 \frac{C_x}{C_o} \quad .$$

After the sign of the output voltage of the operational amplifier 1 is reversed, the output voltage of the operational amplifier 4 (with the residual voltage at the end of the interval $t_o$ taken into account) is described as $$U_1 = -E_o \left(1 + \frac{C_x}{C_o}\right) + E_o \frac{1}{R_xC_o}\left(R_2C_2 \frac{C_x}{C_o} - t_1\right) +$$

$$+ E_o \frac{1}{2L_xC_o}\left[\left(R_2C_2 \frac{C_x}{C_o}\right)^2 + 2R_2C_2 \cdot \frac{C_x}{C_o}t_1 - t_1^2\right] \quad ;$$

where $t_1 = t - t_o$.

The time interval $t$ begins at the instant of starting (connection of power supply).

In this case the voltage at the output of the operational amplifier 16 is given by $$U_3 = +E_o \frac{1}{R_xC_o}\tau g - E_o \frac{1}{L_xC_o}\tau g \left(R_2C_2 \frac{C_x}{C_o} - t_1\right);$$

The output voltage of the operational amplifier 22, with the residual voltage at the end of the interval $t_o$ taken into account, is denoted by $$U_4 = +\frac{C_1}{C_2} \cdot E_o\left(1 + \frac{C_x}{C_o}\right) - \frac{C_1}{C_2}E_o \frac{1}{R_xC_o}\left(R_2C_2 \frac{C_x}{C_o} - t_1\right) -$$

$$- \frac{C_1}{C_2} \cdot E_o \frac{1}{2L_xC_o}\left[\left(R_2C_2 \frac{C_x}{C_o}\right)^2 + 2R_2C_2 \cdot \frac{C_x}{C_o}t_1 - t_1^2\right] +$$

$$+ E_o \frac{1}{2L_xC_o} \cdot \frac{\tau g}{R_1C_2}\left[\left(R_2C_2 \frac{C_x}{C_o}\right)^2 + 2R_2 \frac{C_x}{C_2}t_1 - t_1^2\right] +$$

$$+ E_o \frac{1}{R_xC_o} \frac{\tau g}{R_1C_2}\left(R_2C_2 \frac{C_x}{C_o} - t_1\right) - E_o \frac{C_3}{C_2} +$$

$$+ E_o \frac{1}{R_2C_2}\left(R_2C_2 \frac{C_x}{C_o} - t_1\right)$$

If the equation (2) is satisfied, $$U_4 = 2E_o \frac{C_x}{C_o} - E_o \frac{1}{R_2C_2}t_1$$

At the instant when the output voltage of the operational amplifier 22 rises over the zero level, the voltage at the output of the operational amplifier 1 abruptly reverses its sign again, and the process described above is repeated. The spacing $Tc_x$ of the pulses generated at the output of the operational amplifier 1 is determined by the capacitance $C_x$ of the circuit being analyzed, so that $$T_{Cx} = 4R_2C_2 \frac{C_x}{C_o}$$

At measurement of the resistance $R_x$ of the resistor 48 in the circuit being analyzed, the processes occurring in the circuitry of the device are similar to those discussed above. The output voltages of the operational amplifiers 4 and 22 do not contain components which include $t^2$ and $t_1^2$.

In this case, the spacing $TR_x$ of the pulses generated at the output of the operational amplifier 1 is given by $$T_{Rx} = 4R_2C_2 \frac{R_o}{R_x}$$

and the repetition frequency $f_{Rx}$ of the pulses depends linearly upon Rx:

$$f_{Rx} = \frac{1}{4R_2C_2} \cdot \frac{R_x}{R_o}$$

At measurement of the inductance $L_x$ of the inductance coil 49, the output voltage of the operational amplifier 4 does not include components which comprise $t$, $t_1$, and $t^2$, $t_1^2$. The output voltage of the operational amplifier 16 is zero, and the repetition frequency $f_{Lx}$ of the generated pulses is given by $$f_{Lx} = \frac{1}{4R_2C_2} \cdot \frac{L_x}{L_o}$$

The output signal of the operational amplifier 1 is applied to the input of the pulse spacing and frequency measuring unit 2. The value of the parameter of the analyzed circuit to be determined is derived from the result of measurement.

During measurement of the parameters of the series RLC circuits in the delta-connected multiterminal circuit branches, the output voltage of the operational amplifier 1 (FIG. 3) is delivered through the inverter unit 3 to the noninverting input of the operational amplifier 4 operating as a noninverting scaling amplifier. The operational amplifier 24 operating as a voltage follower sets a voltage across the mid point of two nonanalyzed branches 56 and 57 at a level equal to that of the voltage across the inverting input of the operational amplifier 4. The branch 56 is electrically isolated, and the branch 57 is inserted between two operational amplifiers 4 and 24 with a low output resistance. As a result, the output voltage of the operational amplifier 4 does not depend on the effects of the branches 56 and 57 not analyzed, and is denoted by $$U_1(P) = -U_2(P) \left[ 1 + \frac{Z_x(P)}{Z_o(P)} \right], \quad (3)$$

where $Z_x(p)$ is the operator resistance of the $R_xL_xC_x$ circuit being analyzed, comprising the resistor 53, inductance coil 54 and capacitor 55.

During measurement of the inductances $L_x$ of the inductance coil 54 included into the series $R_xL_xC_x$ circuit in the delta-connected multiterminal circuit branch, the device operates as follows.

At connection of power supply, a voltage, say $-E_o$, is produced at the output of the operational amplifier 1. The output voltage of the operational amplifier 4 varies with time according to the formula (3) as follows:

$$U_1 = +E_o + E_o \frac{L_x}{L_o} + E_o \frac{R_x}{L_o} t + E_o \frac{1}{2L_oC_x} t^2$$

This voltage is applied to the input of the operational amplifier 16, the output voltage thereof is given by $$U_3 = -E_o \frac{R_x}{L_o} \tau g - E_o \frac{1}{L_oC_x} \tau g t$$

The output voltage of the operational amplifier 22, with equation (2) taken into account, can be written as $$U_4 = -E_o \frac{L_x}{L_o} + E_o \frac{1}{R_2 C_2} t$$

In this case $$t_o = R_2 C_2 \frac{L_x}{L_o}$$

At the instant when the output voltage of the operational amplifier 22 rises above the zero level, the output voltage of the operational amplifier 1 abruptly reverses its polarity. In this case, the output voltage of the operational amplifier, with the residual voltage across said amplifier input at reversing the sign (at the end of the interval $t_o$) taken into account, is described by $$U_1 = -E_o \left( 1 + \frac{L_x}{L_o} \right) + E_o \frac{R_x}{L_o} \left( R_2 C_2 \frac{L_x}{L_o} - t_1 \right) + \frac{1}{2L_xC_o} \cdot$$

$$\left[ \left( R_2 C_2 \frac{L_x}{L_o} \right)^2 + 2 R_2 C_2 \frac{L_x}{L_o} t_1 - t_1^2 \right]$$

The output voltage of the operational amplifier 16 varies with time as follows:

$$U_3 = +E_o \frac{R_x}{L_o} \tau g - E_o \frac{1}{L_oC_x} \left( R_2 C_2 \frac{L_x}{L_o} - t_1 \right).$$

With the equation (2) satisfied, the output voltage of the operational amplifier 22 is denoted by $$U_4 = 2E_o \frac{L_x}{L_o} - E_o \frac{1}{R_2 C_2} t_1;$$

Next time when the output voltage of the operational amplifier 22 rises above the zero level, the output voltage of the operational amplifier 1 again reverses its polarity, and the above process is repeated. The spacing $L_xT$ of the generated pulses depends on the inductance being measured in the analyzed circuit, so that $$T_{Lx} = 4R_2 C_2 \frac{L_x}{L_o}$$

At measurement of the capacitance $C_x$ of the capacitor 55 included into the circuit being analyzed, the processes occurring in the circuitry are similar to those described above. The output voltage of the operational amplifier 4 does not include components which comprise $t$, $t_1$, and $t^2$, $t_1^2$.

The spacing $C_xT$ of the generated pulses is given by $$T_{Cx} = 4R_2 C_2 \frac{C_o}{C_x}$$

and the repetition frequency $C_xf$ depends linearly on $C_x$, so that $$f_{Cx} = \frac{1}{4R_2 C_2} \cdot \frac{C_x}{C_o}$$

During measurement of the resistance $R_x$ of the resistor 53 included into the circuit being analyzed, the output voltages of the operational amplifiers 4 and 22 do not include components which comprise $t^2$ and $t_1^2$. The spacing of the generated pulses depends on the value $R_x$:

$$T_{Rx} = 4 R_2 C_2 \frac{R_x}{R_o}$$

During measurement of the parameters of parallel RLC circuits in the star-connected multiterminal circuit branches, the output voltage of the operational amplifier 1 (FIG. 4) is delivered to the noninverting input of the operational amplifier 24. Owing to sufficiently high gain and input resistance inherent in the operational amplifier 24, the voltage produced at the mid point of the branches 61 and 62 of the multiterminal circuit 5 being analyzed is equal to the voltage at the noninverting input of the operational amplifier 24, i.e., to the voltage $U_2$. The operational amplifier 4 operates as an inverting scaling inverter. The output voltage thereof does not depend on the effects of the multiterminal circuit branches 61 and 62 not analyzed, and is given by $$U_1(P) = -U_2(P) \frac{Z_0(P)}{Z_x(P)} \qquad (4)$$

where
$Z_x(p)$ is the operator resistance of the parallel circuit being analyzed, comprising the resistor 58, inductance coil 59 and capacitor 60.

During measurements of the capacitance $C_x$ of the capacitor 60 included into the parallel $R_xL_xC_x$ circuit in the star-connected multiterminal circuit branch, the device operates as follows.

At connection of power supply to the device circuitry, a voltage, say $+E_o$, is produced at the output of the operational amplifier 1. According to the formula (4), the output voltage of the operational amplifier 4 varies with time as follows:

$$U_1 = -E_o \frac{C_x}{C_o} - E_o \frac{1}{R_x C_o} t - E_o \frac{1}{2L_x C_o} t^2$$

Said voltage is delivered to the input of the operational amplifier 16, the output voltage thereof is given by $$U_3 = +E_o \frac{1}{R_x C_o} \tau g + E_o \frac{1}{L_x C_o} \tau g \cdot t$$

The output voltage of the operational amplifier 22 can be expressed as $$U_4 = -\frac{C_1}{C_2} \left( -E_o \frac{C_x}{C_o} - E_o \frac{1}{R_x C_o} t - E_o \frac{1}{2L_x C_o} \cdot t^2 \right) -$$
$$-E_o \frac{1}{R_x C_o} \cdot \frac{\tau g}{R_1 C_2} t - E_o \frac{1}{2L_x C_o} \cdot \frac{\tau g}{R_1 C_2} t^2 - E_o \frac{1}{R_2 C_2} t$$

If
$$\tau g = R_1 C_2 \ ; \ C = C_2 \qquad (5)$$

then
$$U_4 = +E_o \frac{C_x}{C_o} - E_o \frac{1}{R_2 C_2} t \ .$$

In this case, the time interval $t_o$ between the instant of starting (connection of power supply) and the instant when the voltage at the input of the operational amplifier 1 rises above the zero level, is given by $$t_o = R_2 C_2 \frac{C_x}{C_o}$$

After the output voltage of the operational amplifier 1 reverses the sign thereof, the output voltage of the operational amplifier 4 (with the residual voltage at the end of the interval $t_o$ taken into account) is described as $$U_1 = +E_o \frac{C_x}{C_o} - E_o \frac{1}{R_x C_o} \left( R_2 C_2 \frac{C_x}{C_o} - t_1 \right) -$$
$$-E_o \frac{1}{2L_x C_o} \left[ \left( R_2 C_2 \frac{C_x}{C_o} \right)^2 + 2R_2 C_2 \frac{C_x}{C_o} t_1 - t_1^2 \right]$$

where $t_1 = t - t_o$. In this case, the voltage at the output of the operational amplifier 16 is expressed by $$U_3 = -E_o \frac{1}{R_x C_o} \tau g + E_o \frac{1}{L_x C_o} \tau g \left( R_2 C_2 \frac{C_x}{C_o} - t_1 \right)$$

The output voltage of the operational amplifier 22, with the residual voltage at the end of the interval $t_o$ taken into account, is expressed by $$U_4 = -\frac{C_1}{C_2} \cdot E_o \frac{C_x}{C_o} + \frac{C_1}{C_2} E_o \frac{1}{R_x C_o} \left( R_2 C_2 \frac{C_x}{C_o} - t_1 \right) +$$
$$+ \frac{C_1}{C_2} E_o \cdot \frac{1}{2L_x C_o} \left[ \left( R_2 C_2 \frac{C_x}{C_o} \right)^2 + 2R_2 C_2 \frac{C_x}{C_o} t_1 - t_1^2 \right] -$$
$$-E_o \frac{1}{2xC_o} \frac{\tau g}{R_1 C_2} \left( R_2 C_2 \frac{C_x}{C_o} - t_1 \right) - E_o \frac{1}{2L_x C_o} \frac{\tau g}{R_1 C_2} \left[ \left( R_2 C_2 \frac{C_x}{C_o} \right)^2 + \right.$$
$$\left. +2R_2 C_2 \frac{C_x}{C_o} t_1 - t_1^2 \right] - E_o \frac{1}{R_2 C_2} \left( R_2 C_2 \frac{C_x}{C_o} - t_1 \right)$$

If the equation (5) is satisfied, $$U_4 = -2E_o \frac{C_x}{C_o} + E_o \frac{1}{R_2 C_2} t_1$$

At the instant when the output voltage of the operational amplifier 22 rises above the zero level, the voltage at the output of the operational amplifier 1 again reverses the sign thereof abruptly, and the process described above is repeated. In this instance, the spacing $C_xT$ of the produced pulses is determined by the capacitance $C_x$ of the capacitor 60, so that $$T_{Cx} = 4R_2 C_2 \frac{C_x}{C_o}$$

During measurement of the resistance $R_x$ of the resistor 58 included into the circuit being analyzed, the processes occurring in the circuitry of the device are similar to those already described. The output voltages of the amplifiers 4 and 22 do not include components comprising $t^2$ and $t_1^2$.

The repetition frequency $f_{Rx}$ of the generated pulses is determined by the resistance $R_x$ as follows:

$$f_{Rx} = \frac{1}{4R_2 C_2} \cdot \frac{R_x}{R_o}$$

At measurement of the inductance $L_x$ of the coil 59 included into the circuit being analyzed, the output voltage of the operational amplifier 4 does not include components comprising $t$, $t_1$, and $t^2$, $t_1^2$. The output voltage of the operational amplifier 16 is zero, and the repetition frequency $f_{Lx}$ of the generated pulses depends linearly on the value $L_x$, so that $$f_{Lx} = \frac{1}{4R_2 C_2} \cdot \frac{L_x}{L_o}$$

During measurement of the parameters of the series RLC circuits in the star-connected multiterminal circuit branches, the output voltage of the operational amplifier 1 (FIG. 5) is delivered to the input of the unit 6 of calibrated elements. With a sufficiently high gain inherent in the operational amplifier 4, the voltage at the mid point of the branches 66 and 67 in the multiterminal circuit 5 being analyzed is expressed by $$U_5(P) = -U_2(P) \frac{Z_x(P)}{Z_o(P)}$$

where

Z$_x$(p) is the operator resistance of the series circuit R$_x$L$_x$C$_x$ being analyzed, comprising the resistor 63, inductance coil 64 and capacitor 65. Said voltage is supplied through the branch 66 of the multiterminal circuit 5 being analyzed and is applied to the noninverting input of the operational amplifier 24 which operates as a noninverting voltage amplifier. With a sufficiently high input resistance inherent in the operational amplifier 24, the output voltage thereof does not depend on the effects of the branch 66, and is given by $$U_6(P) = U_5(P) = -U_2(P) \frac{Z_x(P)}{Z_o(P)} \quad (6)$$

At measurement of the inductance of the coil 64, the device operates as follows.

With power supply connected to the circuitry of the device, a voltage, say +E$_o$, is produced at the output of the operational amplifier 1. According to the formula (6), the output voltage of the operational amplifier 24 varies with time as follows:

$$U_6 = -E_o \frac{L_x}{L_o} - E_o \frac{R_o}{L_o} t - E_o \frac{1}{2L_oC_x} t^2$$

Said voltage is applied to the input of the operational amplifier 16, the output voltage thereof is given by $$U_3 = +E_o \frac{R_o}{L_o} \tau g + E_o \frac{1}{2L_oC_x} \tau g t$$

The output voltage of the operational amplifier 22, with the equation (5) satisfied, is expressed by $$U_4 = +E_o \frac{L_x}{L_o} - E_o \frac{1}{R_2C_2} t.$$

In this case, $$t_o = R_2C_2 \frac{L_x}{L_o}$$

At the instant when the output voltage of the operational amplifier 22 rises above the zero level, the output voltage of the operational amplifier 1 abruptly reverses the polarity thereof. With the residual voltage across the output of the operational amplifier 1 by the instant of the phase reversal taken into account, and with the equation (5) satisfied, the output voltage of the operational amplifier 22 is given by $$U_4 = -2 \frac{L_x}{L_o} + E_o \frac{1}{R_2C_2} t$$

Next time when the output voltage of the operational amplifier 22 rises above the zero level, the output voltage of the operational amplifier 1 abruptly reverses the polarity thereof again, and the process described above is repeated. The spacing T$_{Lx}$ of the generated pulses depends on the value L$_x$, so that $$T_{Lx} = 4R_2C_2 \frac{L_x}{L_o};$$

During measurement of the resistance R$_x$ of the resistor 63 included into the circuit 5 being analyzed, the processes occurring in the circuitry of the device are similar to those already described. The output voltages of the operational amplifiers 24 and 22 do not include the components comprising $t^2$ and $t_1^2$. The spacing T$_{Rx}$ of the generated pulses is given by $$T_{Rx} = 4R_2C_2 \cdot \frac{R_x}{R_o}$$

At measurement of the capacitance C$_x$ of the capacitor 65, the output voltage of the operational amplifier 24 does not include components comprising $t$, $t_1$, and $t^2$, $t_1^2$. The repetition frequency $f_{Cx}$ of the generated pulses is determined by the value C$_x$, so that $$f_{Cx} = \frac{1}{4R_2C_2} \cdot \frac{C_x}{C_o}$$

During measurement of the parameters of the parallel two-terminal RLC circuits, the output voltage of the operational amplifier 1 (FIG. 6) delivered through the circuit being analyzed, comprising the resistor 68, coil 69 and capacitor 70, is applied to the input of the operational amplifier 4. The feedback circuit of the operational amplifier 4 includes the unit 6 of calibrated elements. The operational amplifier 4 operates as an inverting scaling amplifier, and the output voltage thereof is expressed by $$U_1(p) = -U_2(p) \frac{Z_o(p)}{Z_x(p)}$$

where

Z$_x$ (p) is the operator resistance of the R$_x$L$_x$C$_x$ circuit being analyzed, comprising the resistor 68, inductance coil 69 and capacitor 70.

The output voltages of the units in the device varies with time in the same way as in the case with measurement of the parameters of parallel RCL circuits in the star-connected multiterminal circuit branches.

The spacing T$_{Cx}$ of the generated pulses during measurement of the capacitance C$_x$ of the capacitor 70 is given by $$T_{Cx} = 4R_2C_2 \frac{C_x}{C_o}$$

During measurement of the resistance $R_x$ of the resistor 68, the repetition frequency $f_{Rx}$ of the generated pulses is given by $$f_{Rx} = \frac{1}{4R_2C_2} \cdot \frac{R_x}{R_o}$$

and at measurement of the inductance $L_x$ of the inductance coil 69, said repetition frequency is given by $$f_{Lx} = \frac{1}{4R_2C_2} \cdot \frac{L_x}{L_o}$$

During measurement of the parameters of the series two-terminal circuits, the output voltage of the operational amplifier 1 (FIG. 7) is delivered to the input of the operational amplifier 4 through the unit 6 of calibrated elements. The circuit 5 being analyzed, comprising the resistor 71, inductance coil 72 and capacitor 73, is inserted into the feedback circuit of the operational amplifier 4. In this case, the operational amplifier 4 operates as an inverting scaling amplifier, the output voltage thereof is given by $$U_1(p) = -U_2(p) \frac{Z_x(p)}{Z_o(p)}$$

where $Z_x(p)$ is the operator resistance of the circuit 5 being analyzed, comprising the resistor 71, inductance coil 72 and capacitor 73.

The output voltage of the operational amplifier 4 varies with time in the same way as the output voltage of the operational amplifier 24 (FIG. 5) during measurement of the parameters of the series RLC circuits in the star-connected multiterminal circuit branches.

The processes occurring in the circuitry of the device are similar to those observed in the case of measurement of the parameters of the series RLC circuits in the star-connected multiterminal circuit branches.

The spacing $T_{Lx}$ of the generated pulses during measurement of the inductance $L_x$ of the coil 72 (FIG. 7) is expressed by $$T_{Lx} = 4R_2C_2 \frac{L_x}{L_o}$$

and said spacing at measurement of the resistance $R_x$ of the resistor 71 is given by $$T_{Rx} = 4R_2C_2 \frac{R_x}{R_o}$$

The repetition frequency $f_{Cx}$ of the generated pulses during measurement of the capacitance $C_x$ of the capacitor 73 is expressed by $$f_{Cx} = \frac{1}{4R_2C_2} \cdot \frac{C_x}{C_o}$$

The device for measurement of the parameters of electric circuit elements, according to the invention, is constructed in the form of a multipurpose electric circuit tester, and permits measurements of resistances of resistors, capacitances of capacitors and inductances of coils, as well as resistances, capacitances and inductances of electric circuits without disturbing the integrity thereof, which is not possible in the case with other prior measuring devices.

The relative measuring error of the device of the present invention lies in the range from 0.1 percent (at measurement of parameters of discrete components) to 1 percent (at measurement of parameters of compound multiterminal circuits).

The device is distinguished for simplicity in manufacture and operation, and for small dimensions, and can be operated on line with electronic computers.

What is claimed is:

1. A device for measurement of parameters of compound electric circuits, comprising: a first operational amplifier; an inverter unit, the input thereof being connected to the output of said first operational amplifier; a second operational amplifier, the inverting input thereof being connected to one terminal of an electric circuit being analyzed, with a noninverting input also provided; a ground bus electrically coupled with said noninverting input of said second operational amplifier; a unit of calibrated elements, the output thereof being connected to said terminal of the electric circuit being analyzed; a pulse spacing and frequency measuring unit, the input thereof being connected to the output of said first operational amplifier; a first resistor, one terminal thereof being connected to the output of said first operational amplifier; a pulse shaping unit, the input thereof being also connected to the output of said first operational amplifier; an electronic switch, incorporating a control input, whereto the output of said pulse shaping unit is connected, and another input; a third operational amplifier, the input thereof being connected to said other input of said electronic switch, and the output thereof connected to the output of said electronic switch; a resistor inserted into the feedback circuit of said third operational amplifier; a network of two series-connected capacitors, with one terminal of said network connected to said other input of said electronic switch; a second resistor, one terminal thereof being connected to the output of said electronic switch, and the other terminal thereof being connected to the other terminal of said first resistor and to the other terminal of said network of two series-connected capacitors; a fourth operational amplifier, the input thereof being connected to the other terminal of said second resistor, and the output thereof being connected to the input of said first operational amplifier; a capacitor inserted into the feedback circuit of said fourth operational amplifier; a second capacitor, one terminal thereof being connected to the input of said fourth operational amplifier; a fifth operational amplifier; a switchgear electrically coupling the output of said first operational amplifier, the second and third terminals of said electric circuit being analyzed, the noninverting input and output of said second operational amplifier, the inverting and noninverting inputs of said fifth operational amplifier, the input of said unit of calibrated elements and the mid point of said two series-connected capacitors with the inverting and noninverting inputs and output of said fifth operational amplifier, with the input of said unit of calibrated elements, with the output of said second operational amplifier, with the output of said inverter unit, with the other terminal of said second capacitor with the second and third terminals of said electric circuit being analyzed, with the output of said unit of calibrated elements, with the output of said first operational amplifier a and with said ground bus; two selector switches of said switchgear, whereby, with said selector switches placed to the first position, the output of said first operational amplifier is connected to the other terminal of said second capacitor, the noninverting input of said second operational amplifier is connected to the output of said inverter unit, and the output of said second operational amplifier is connected to the mid point of said two series-connected capacitors and to the input of said unit of calibrated elements, the output thereof is connected to the noninverting input of said fifth operational amplifier, the inverting input and output thereof are connected to the third terminal of said electric circuit being analyzed, the second terminal thereof is connected to said ground bus, whereby the device permits measurement of parameters of parallel RLC circuits in delta-connected multiterminal circuit branches; with said first and second selector switches placed to the first and second positions, respectively, the output of said first operational amplifier is connected to the other terminal of said second capacitor, the noninverting input of said second operational amplifier is connected to the output of said inverter unit, and the output thereof is connected to the mid point of said two series-connected capacitors and to the second terminal of said electric circuit being analyzed, the third terminal thereof is connected to the inverting input and output of said fifth operational amplifier, the noninverting input thereof is connected to the output of said unit of calibrated elements, the input thereof is in its turn connected to said ground bus, whereby the device permits measurement of parameters of series RLC circuits in the delta-connected multiterminal circuit branches; with said first and second selector switches placed to the second and first positions, respectively, the output of said first operational amplifier is connected to the noninverting input of said fifth operational amplifier, the inverting input thereof is connected to the second terminal of said electric circuit being analyzed, the third terminal thereof is connected to the output of said fifth operational amplifier, the noninverting input of said second operational amplifier is connected to said ground bus, the output of said second operational amplifier is connected to the input of said unit of calibrated elements and to the mid point of said two series-connected capacitors, whereby the device permits measurement of parameters of parallel RLC circuits in star-connected multiterminal circuit branches; with both said selector switches placed to the second position, the output of said first operational amplifier is connected to the input of said unit of calibrated elements, the noninverting input of said second operational amplifier is connected to said ground bus, the output of said second operational amplifier is connected to the second terminal of said electric circuit being analyzed, the third terminal thereof is connected to the noninverting input of said fifth operational amplifier, the inverting input thereof is connected to the output of the same operational amplifier, said output thereof is connected to the mid point of said two series-connected capacitors, whereby the device permits measurement of parameters of series RLC circuits in star-connected multiterminal circuit branches.

* * * * *